United States Patent
Loertscher et al.

(10) Patent No.: US 10,972,048 B2
(45) Date of Patent: Apr. 6, 2021

(54) PHOTOVOLTAIC MODULE

(71) Applicant: International Business Machines Corporation, Armonk, NY (US)

(72) Inventors: Emanuel Loertscher, Bonstetten (CH); Bruno Michel, Zurich (CH); Stefano S. Oggioni, Besana in Brianza (IT); Stephan Paredes, Zurich (CH); Patrick Ruch, Tomils (CH); Mauro Spreafico, Sesto San Giovanni (IT); Giorgio Viero, Stezzano (IT)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 127 days.

(21) Appl. No.: 15/800,146

(22) Filed: Nov. 1, 2017

(65) Prior Publication Data

US 2018/0248512 A1    Aug. 30, 2018

Related U.S. Application Data

(63) Continuation of application No. 15/443,455, filed on Feb. 27, 2017.

(51) Int. Cl.
*H01L 31/02* (2006.01)
*H01L 31/05* (2014.01)
(Continued)

(52) U.S. Cl.
CPC .......... *H02S 50/00* (2013.01); *H01L 31/0201* (2013.01); *H01L 31/0504* (2013.01);
(Continued)

(58) Field of Classification Search
CPC ... H01L 31/0504–0543; H01L 31/0201; H02S 20/32
See application file for complete search history.

(56) References Cited

U.S. PATENT DOCUMENTS 4,789,641 A * 12/1988 Inuzuka ................. H01L 31/075
                                                              136/244
5,389,158 A * 2/1995 Fraas .................... H01L 25/043
                                                              136/244
(Continued)

OTHER PUBLICATIONS

List of IBM Patents or Patent Applications Treated As Related; Date Filed: Nov. 1, 2017, 2 pages.
(Continued)

*Primary Examiner* — Niki Bakhtiari
(74) *Attorney, Agent, or Firm* — Cantor Colburn LLP; Daniel Morris

(57) ABSTRACT

The present invention is notably directed to a photovoltaic module, or PV module, comprising an array of photovoltaic cells, or PV cells, and electrical interconnects. The array of PV cells comprises N portions, N≥2, where the portions comprise, each, disjoint sets of PV cells of the array. The electrical interconnects connect the PV cells and the N portions of the array so as for PV cells within each of said portions to be electrically connected in parallel and the N portions to be connected in series. The PV cells and the portions are connected, via said interconnects, so to output an electrical current, in operation. The electrical interconnects are otherwise configured to provide electrical signals from each of the N portions. The invention is further directed to related systems and methods of fabrication and operation.

13 Claims, 6 Drawing Sheets

(51) Int. Cl.
   *H02S 50/00* (2014.01)
   *H02S 20/32* (2014.01)
   *H02S 20/24* (2014.01)
   *H02S 40/22* (2014.01)

(52) U.S. Cl.
   CPC ............. *H02S 20/24* (2014.12); *H02S 20/32* (2014.12); *H02S 40/22* (2014.12); *Y02E 10/52* (2013.01)

(56) References Cited

U.S. PATENT DOCUMENTS

| | | | |
|---|---|---|---|
| 5,669,987 A | 9/1997 | Takehara et al. | |
| 8,153,944 B2 | 4/2012 | Hines et al. | |
| 9,291,696 B2 | 3/2016 | Adest et al. | |
| 2005/0000561 A1* | 1/2005 | Baret | H01L 31/048 136/244 |
| 2010/0006865 A1* | 1/2010 | Nakata | H01L 25/0753 257/88 |
| 2010/0313930 A1 | 12/2010 | Yokobayashi et al. | |
| 2012/0060895 A1 | 3/2012 | Rubin et al. | |
| 2012/0266938 A1* | 10/2012 | Goei | H01L 31/0547 136/246 |
| 2014/0299176 A1* | 10/2014 | Gerster | H01L 31/052 136/246 |
| 2015/0162472 A1* | 6/2015 | Iyatani | H01L 31/0488 136/251 |
| 2015/0229266 A1 | 8/2015 | Hayden et al. | |
| 2015/0263182 A1* | 9/2015 | Vornbrock | H01L 31/0201 136/244 |

OTHER PUBLICATIONS

Loertscher et al., "Photovoltaic Module," U.S. Appl. No. 15/443,455, filed Feb. 27, 2017.
Hu, Jun et al. "An intelligent photosensitive tracker for concentrating PV system." Abstract. Proceedings of 2012 International Conference on Measurement, Information and Control (2012): 917-921.
Salemi, A. et al. "Dense array connections for photovoltaic systems in concentration." Abstract. Progress in Photovoltaics: Research and Applications 19.4 (2011): 379-390.
Siaw, Fei-Lu et al. "A Systematic Method of Interconnection Optimization for Dense-Array Concentrator Photovoltaic System." The Scientific World Journal 2013. Article ID 275169. (2013): 1-11.

* cited by examiner

PHOTOVOLTAIC MODULE

DOMESTIC PRIORITY

This application is a continuation of U.S. application Ser. No. 15/443,455, filed Feb. 27, 2017, the contents of which are incorporated by reference herein in its entirety.

BACKGROUND

The invention relates in general to the field of photovoltaic modules, comprising arrays of photovoltaic cells arranged side-by-side, photovoltaic systems comprising such modules and related methods of fabrication and operation (e.g., to optimize electrical outputs of such modules). In particular, the invention is related to a photovoltaic module comprising an array of photovoltaic cells, where the array is partitioned into portions (e.g., quadrants) of photovoltaic cells, which are connected in parallel in each portion, whereas the portions are connected in series.

The following definitions are assumed throughout this description.

Photovoltaics (PV) describes the generation of electrical power by converting solar radiation into direct current electricity through semiconductors exhibiting the photovoltaic effect;

A photovoltaic cell (or PV cell, also "solar cell" or "photoelectric cell") is a solid state device that converts energy of light directly into electricity by virtue of the photovoltaic effect;

A photovoltaic array or module (also "solar module", "solar panel" or "photovoltaic panel") is an assembly of connected photovoltaic cells, where photovoltaic cells are arranged side-by-side in the array;

A photovoltaic system typically includes at least one module of photovoltaic cells and interconnection wiring;

Concentrated photovoltaic (CPV) systems, including high concentrator photovoltaics (HCPV) systems, use optics (e.g., lenses) to concentrate a large amount of sunlight onto a small area of photovoltaic materials to generate electricity. Concentration allows for usage of smaller areas of solar cells.

CPV systems aim at achieving high geometrical concentrations of solar irradiance on PV cells, typically in the order of 500-3000 suns. Such concentrations are typically enabled by faceted mirrors, focusing light on one single focal plane. However, the mirror topology is never perfect. The varying focal points and acceptance apertures of the individual mirrors lead to a non-homogenous illumination pattern on the focal plane. Optical mixers are used in some cases, to homogenize the illumination pattern. Yet, this may come at a price of reducing the concentration efficiency.

The concentrating optics used in CPV systems generally result in non-uniform illumination on the PV cell surface. A more uniform illumination would come at a cost of lower efficiency, since more optical elements need be integrated. To reduce cost of packaging and cooling, arrays of PV cells (placed side-by-side) are sometimes designed with a common support structure which provides electrical interconnection and cooling. However, in this configuration the PV cells in the array are exposed to different illumination and therefore exhibit different electrical output characteristics. In order to have the same electrical output for each PV cell, several CPV solutions rely on pairing a single optical element with a single PV cell (point-focus systems). This only works, however, when none of the optical elements is shaded by objects in the light path, e.g., neighboring systems.

Compared to point-focus systems, dense array systems use closely packed PV cells, which involve several cells per concentrating element. Such solutions may thus offer a cost advantage and are less prone to shading. In dense array systems, heat generation may be higher than for point-focus systems because there is less surface area per cell for heat dissipation. With appropriate thermal management, the heat generated in a dense array system can be used for polygeneration (i.e., production of electricity, heat and additional resources like, e.g., potable water or air-conditioning), which results in improved cost-performance of the overall system.

In solar concentrators in concentrated photovoltaics, in particular in point focus systems, it is essential that the concentrated beam be well aligned to the PV receiver. On this basis, the present inventors set a goal of devising a solution, which would allow a same PV receiver to be used to align a concentrated beam during assembly of the system as well as later during tracking operation to ensure optimal illumination of the PV receiver and therefore maximizing the electrical output of the system.

SUMMARY

According to a first aspect, the present invention is embodied as a photovoltaic module, or PV module, comprising an array of photovoltaic cells, or PV cells, and electrical interconnects. The array of PV cells comprises N portions, N≥2, where the portions comprise, each, disjoint sets of PV cells of the array. The electrical interconnects connect the PV cells and the N portions of the array so as for PV cells within each of said portions to be electrically connected in parallel and the N portions to be connected in series. The PV cells and the portions are connected, via said interconnects, so to output an electrical current, in operation. The electrical interconnects are otherwise configured to provide electrical signals from each of the N portions.

As electrical signals can be obtained from each of the portions, thanks to the interconnects, a feedback signal can in turn be obtained to adjust the illumination pattern on the array and, in turn, improve the in-series electrical signals as obtained in output of the portions. As a consequence, the present solution allows electrical current of a (typically dense) photovoltaic array exposed to inhomogeneous illumination (e.g., as generated in most point-focus systems) to be extracted in such a way that each portion is exposed to a same amount of irradiance, which increases the module's electrical efficiency as well as the optical efficiency of the system. Additional advantages of the present solutions are described in the next section.

In embodiments, the electrical interconnects are further configured so as to allow a voltage (e.g., an effective voltage or an open circuit voltage) and/or a current produced by each of the N portions to be measured. Yet, although voltage and/or current produced by each portion may, in principle, be used as a feedback signal, it is most practical to rely on voltages, as mere exposure to ambient light can then be exploited to align or calibrate the module. If the systems runs without load, the voltage measured is an open circuit voltage. However, the system can also be used to drive a current into a DC step-up converter, in which case an effective voltage over each of the N portions is obtained, rather than an open circuit voltage. In all cases, a voltage may be relied upon, both in open-circuit conditions and in operating conditions. Note that the simultaneous measurement of an open-circuit voltage and a current would, by definition, not be possible. However, the electrical interconnects may be designed so as to allow both quantities (i.e., a voltage and a current) to be measured at different times. For example, the current flow may be interrupted, in order to measure an open-circuit voltage, which can be achieved by a switch or circuit breaker suitably located in the circuit.

In some embodiments, N is even and the N portions adjoin at a center of the array of PV cells. In general, the array may have a polygonal shape and the portions may be inscribed polygons. More practical, however, is to have a rectangular array with rectangularly shaped portions, to ease the design and fabrication of the electrodes, as discussed below. For example, the array can be rectangular and decompose into N=4 rectangular portions of distinct sets of cells, in which case each of the portions meet two contiguous portions at edges extending parallel to symmetry axes of the array.

The electrical interconnects can comprise, for each of the N portions, a pair of stacked electrode elements, including a top electrode element and a bottom electrode element, each comprising elongated contact elements. The top electrode element is arranged between PV cells of said each of the N portions and the bottom electrode element. The elongated contact elements of the top electrode elements are rotated by $\pi/2$ with respect to elongated contact elements of the bottom electrode elements, so as to form crosspoint structures that electrically connect PV cells within said each of the N portions in parallel. Note that such a connection scheme does not impact the areal density of PV cells in the array or the footprint of the module.

In embodiments, the bottom electrode element of a nth portion of said N portions is in electrical communication with the top electrode element of a n+1th portion of said N portions, $n \in [1, N-1]$, where the nth portion and the n+1th portion are contiguous in the array, whereby the N portions are electrically connected in series. The connection scheme that results does again not impact the areal density of PV cells in the array.

The electrical interconnects can further comprises N-1 peripheral conductors, each connecting the bottom electrode element of the nth portion with the top electrode element of the n+1th portion. Using lateral connectors to connect portions frees some space for in-portion interconnects and will have only a small impact on the footprint of the module.

In some embodiments, the top electrode elements further comprise, each, a lug protruding in-plane, outwardly from the array, in electrical contact with one of the N peripheral conductors.

According to another aspect, the invention is embodied as a photovoltaic system, comprising a photovoltaic module according to any of the above embodiments.

In embodiments, the photovoltaic system further comprises a monitoring unit, in electrical communication with the electrical interconnects of the module, and configured to monitor electrical signals provided from each of the N portions, via the electrical interconnects.

The photovoltaic system can further comprises: optical transmission means configured to: direct light onto said array of PV cells; and positioning means, so as for a position and/or an orientation of the optical transmission means and/or the PV module to be adjustable in the PV system, via said positioning means; and a controller operatively connected to the positioning means to adjust said position and/or said orientation, based on feedback signals, where the monitoring unit is operatively connected to the controller to provide it with said feedback signals, based on electrical signals from said each of the N portions that it monitors, in operation.

In some embodiments, the monitoring unit is configured to compute said feedback signals by minimizing one or more differences between voltages outputted by the N portions, based on the monitored electrical signals.

The optical transmission means can comprises an optical concentrator, the latter configured to concentrate light onto said array of PV cells.

In embodiments, the system is a high concentrator photovoltaics system, or HCPV system.

According to another aspect, the invention is embodied as a method of operating a photovoltaic module according to any of the embodiments above. The method comprises: directing light onto said array of photovoltaic cells, or PV cells; collecting an output electrical current from the N portions connected in series; and collecting electrical signals from each of the N portions.

In some embodiments, the method further comprises adjusting an illumination pattern of light directed onto said array of PV cells to increase electrical power outputted from the N portions, based on electrical signals collected from each of the N portions.

The described methods can be implemented to operate a photovoltaic system comprising optical transmission means, positioning means, and a controller, as described above, and the step of adjusting the illumination pattern is performed by adjusting a position and/or an orientation of the optical transmission means and/or the array of PV cells.

In embodiments, the method further comprises, while collecting electrical signals from each of the N portions, measuring, via said electrical interconnects, a voltage from said each of the N portions, and adjusting the illumination pattern is performed based on voltages measured for the N portions.

Adjusting the illumination pattern can be performed so as to minimize one or more differences between measured voltages.

In some embodiments, said optical transmission means comprises an optical concentrator and the step of directing light onto said array of photovoltaic cells comprises concentrating light onto said array of PV cells, thanks to said optical concentrator.

The illumination pattern can be repeatedly adjusted so as to track a moving source of the light.

In embodiments, the method is implemented for aligning a photovoltaic system as described earlier, and the optical transmission means comprises an optical concentrator. The method further comprises, while collecting electrical signals from each of the N portions: aligning the array of PV cells and/or the optical concentrator towards a source of the light, to increase electrical power outputted from the N portions.

According to a final aspect, the invention is embodied as a method of fabrication of a photovoltaic module according to any one of the above embodiments, which comprises fabricating said array of PV cells and said electrical interconnects.

In some embodiments, the fabrication of the array of PV cells comprises, for each of the portions, sorting cells within said each of the portions to minimize differences between photovoltaic voltages of the sorted cells, e.g., while being exposed to different levels of illumination.

Exposing cells in a parallel, connected array to different levels of illumination will typically not provide an optimal electrical efficiency (maximal current and maximal voltage). To improve this situation, cells can be sorted such that cells under high illumination provide a same voltage as cells under lower illumination. Note that there can be substantial voltage difference between highly illuminated cells and poorly illuminated cells. However, the sorting strategy serves to minimize the differences and therefore maximize the overall electrical efficiency. This sorting can be done differently for the different arrays such that the electrical efficiency is optimal and all cells in a fabrication batch can be used (maximal fabrication yield). This, in turn, makes it possible to reduce the production cost of the receiver and optimize the electrical yield of the receiver under the final illumination.

Devices, systems and methods embodying the present invention will now be described, by way of non-limiting examples, and in reference to the accompanying drawings.

BRIEF DESCRIPTION OF THE DRAWINGS

FIG. 1 depicts an illumination pattern onto the PV module; FIG. 2 translates irradiance intensity of the illumination patter into (rounded) numbers; and FIG. 3 illustrates principles of electrical connections of cells within portions of the module and of the portions, as relied on in embodiments;

Figure 1:
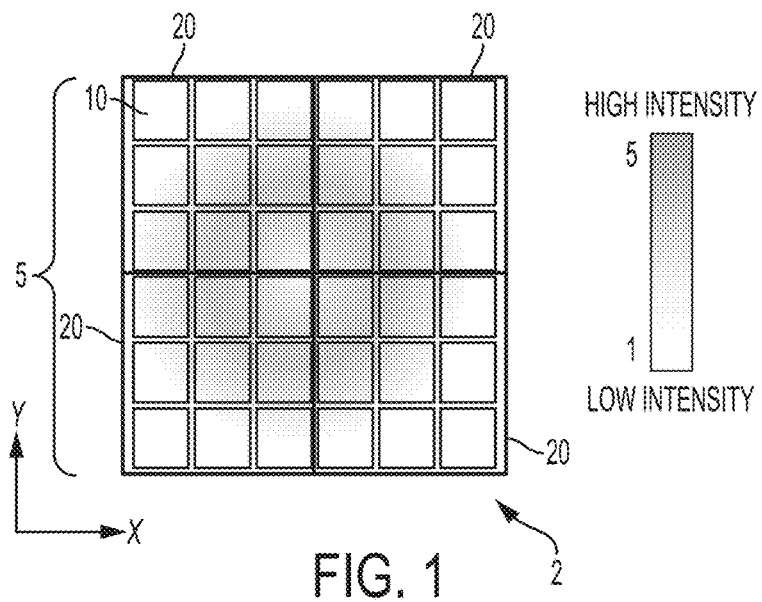
FIGS. 1, 2 and 3 are top views of a photovoltaic module, or PV module, according to embodiments.
Figure 2:
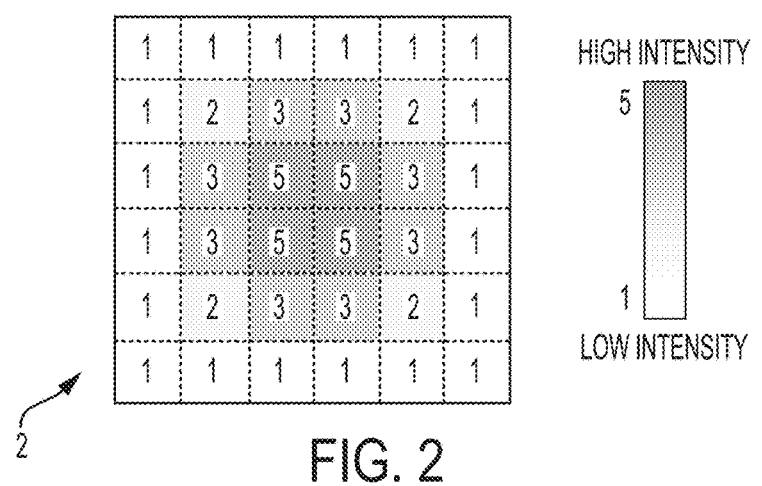

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

In reference to FIGS. 1-4, an aspect of the invention is first described, which concerns a photovoltaic (PV) module 2. This module basically comprises an array 5 of PV cells 10 and specific electrical interconnects 31-37. As usual, PV cells are arranged side-by-side in the array 5.

The array 5 of PV cells 10 decomposes into N portions 20 of cells, where N≥2 (e.g., N=4), whereby each of the portions 20 comprises disjoint sets of PV cells 10 of the array 5. That is, the portions 20 comprises distinct sets of cells 10. The union of all portions 20 form a superset of cells that typically corresponds to the whole set of cells of the entire array 5. Yet, one or more cells of the PV receiver may be subject to a partly or fully separate electrical connection scheme, e.g., for control purposes. However, the N portions of the array 5 are all connected in series.

We note that "array" as used above does not necessarily imply a square or a rectangular structure. Rather, an "array" means an ordered arrangement of cells, e.g., aligned along rows and columns, which may be arranged according to any polygonal shape. Yet, the array 5 can be rectangular in practice (i.e., it forms a matrix of n×m cells), possibly square (n=m). In addition, each of the N portions can comprise a same number nc of cells, where, e.g., nc=(n×m)/N, assuming a rectangular array of n×m cells. For instance, the accompanying drawings depict embodiments where PV cell arrays comprise four portions, also referred to as quadrants herein.

Figure 3:
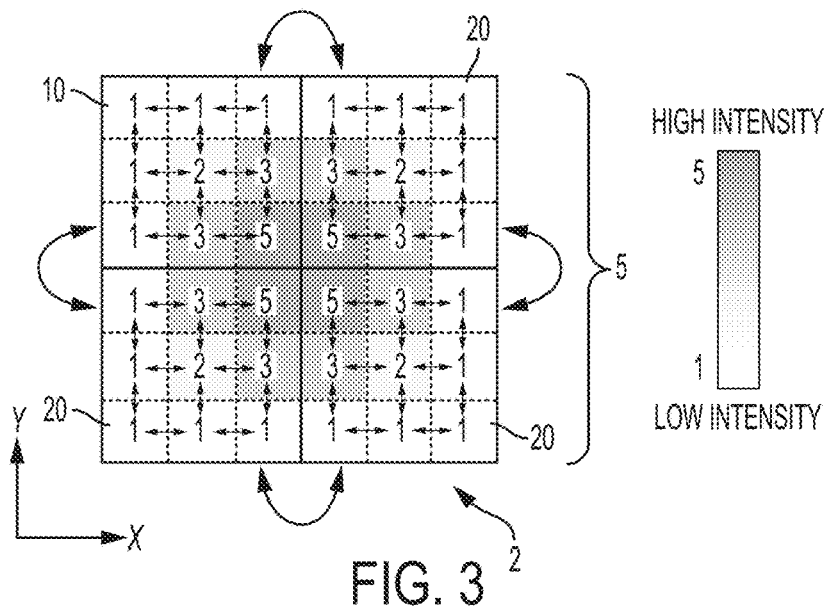

The electrical interconnects 31-37 are configured to connect the PV cells 10 and the N portions 20 of the array 5, so as for PV cells 10 within each of the portions 20 to be electrically connected in parallel, as illustrated in FIG. 3. Meanwhile, the N portions 20 are connected in series, thanks to such interconnects 31-37, to output an electrical current, in operation. Now, the present electrical interconnects 31-37 are not just designed so as to extract electrical outputs from the array of PV cells, they are furthermore configured to provide electrical signals from each of the N portions 20, i.e., independently. The interconnection elements can have a low electrical resistance (e.g., made of copper), and further can use contacts with low electrical resistance to the PV cells.

Figure 8:
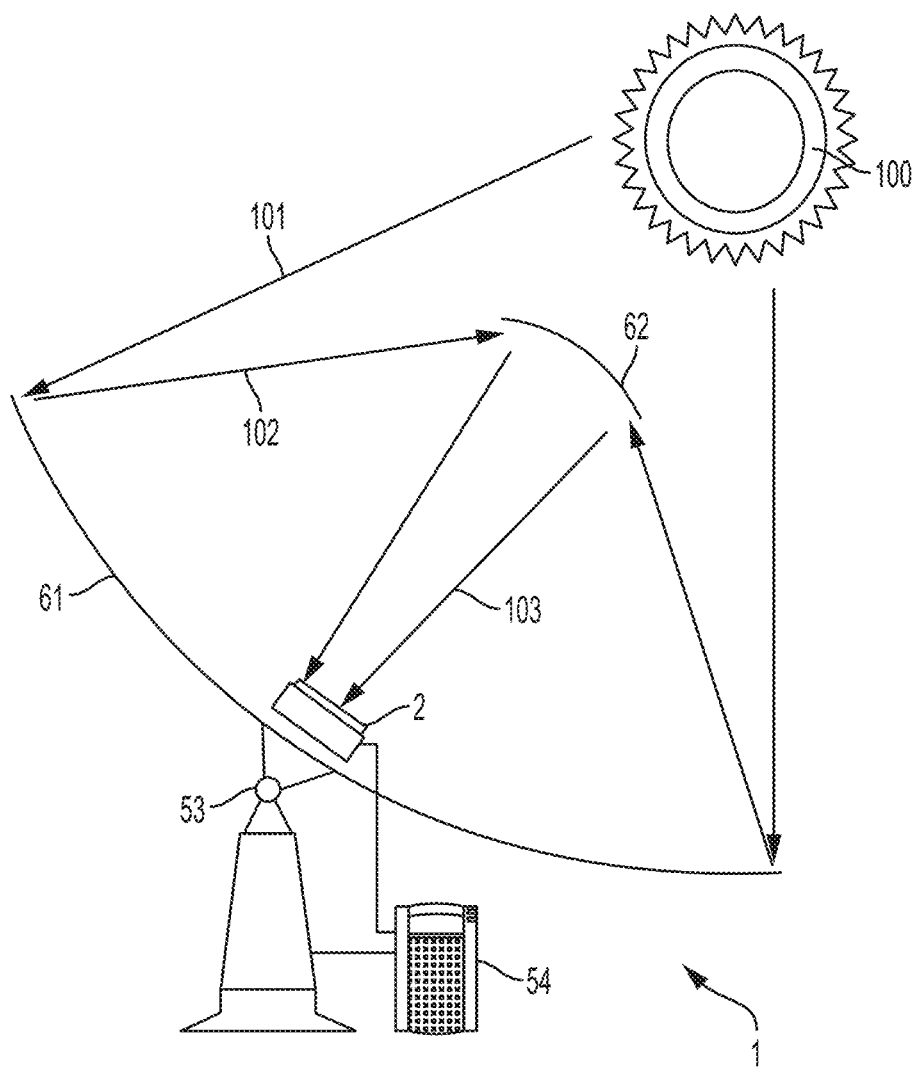
FIG. 8 depicts a high concentrator photovoltaics system, involving a PV module, according to embodiments.

The present module 2 will typically be part of a PV system 1 that may for instance comprise an optical concentrator, as assumed in FIG. 8.

The electrical interconnects 31-37, which connect PV cells in parallel in each of the portions, which are themselves connected in series, allow to mitigate "hot spots" or inequalities in the electrical current paths. In detail, since electrical signals can be obtained from each of the portions 20, a feedback signal can accordingly be obtained, which can be used to adjust the illumination pattern and, in turn, improve the in-series electrical signals as obtained in output of the PV cell portions 20. In that respect, it should be noted that the serial connection of the N portions makes the overall voltage additive, while the current output is determined by the portion having the lowest current output.

As a consequence, the present solution allows electrical current of a (typically dense) PV array 5 exposed to inhomogeneous illumination (e.g., as generated in most point-focus systems) to be extracted in such a way that each cell portion is exposed to exactly (or essentially) the same amount of irradiance. This, as it can be realized, results in increasing the module's electrical efficiency as well as the optical efficiency of the module 2 (or the system 1 comprising such a module).

The electrical interconnects 31-37 may for instance be adapted to deliver a voltage or current signal, or combination thereof, for each portion, which is characteristic for the symmetry of the illumination pattern and thereby provides a means to accurately align an illumination pattern on a PV receiver. The same principle may be leveraged for sun tracking purposes or, even, during the fabrication of the PV cells 10, as described later. Also, the present solution allows step-up converters with a higher efficiency and use of lower amplification circuits that are much cheaper.

On the contrary, classical serial connections of PV cells as used in the prior art suffer from imbalanced currents that require reverse biased diodes to prevent negative voltages on some of the cells. Now, and notwithstanding the use of reverse biased diodes, the overall efficiency of prior systems is suboptimal in practice. Thus, another benefit of the present approach is to eliminate the need for bypass diodes, which would else typically be needed when different photovoltaic cells, arranged in series, provide different photovoltaic currents.

As it turns out, the present approach allows existing methods of sun-tracking or alignment to be improved. In addition, this approach can be used to handle high-currents in dense array of PV cells for concentrator PVs. It further enables methods to assemble and wire a dense array of PV cells that allow high yield during fabrication of dense PV cell arrays and high electrical efficiency of the entire array to be achieved.

The PV cells can be as identical as possible, in terms of electrical characteristics, so as for the portions to output currents that are (as possible) identical under a perfectly symmetric illumination pattern. Now, in practice, PV cells may slightly differ in their electrical characteristics, within each portion, for example due to process variation in the manufacturing of the cells. Yet, PV cells may be sorted, prior to the assembly process, e.g., according to the electrical characteristics of these cells which are measured after cell fabrication as part of typical quality control routines. That is, cells within each portion may be sorted such that relative photovoltaic voltages of the cells are as identical as possible under operating conditions, so that maximum power can be extracted, as further discussed later in respect of another aspect of the invention.

In general, the present electrical interconnects 31-37 may be configured so as to enable the measure of a voltage and/or a current produced by each of the N portions 20, based on the electrical signals they provide from each of the N portions 20. Now, although current signals may be relied on, in principle, most practical is to rely on voltages, as mere exposure to ambient light may then be exploited to assemble or align the PV module.

In general, the array may have a polygonal shape and the portions may be inscribed polygons. Yet, the number N of portions can be even, which, in practice, makes it easier to symmetrize an illumination pattern across the array 5, be it for sun tracking or alignment purposes. In all cases, the array 5 of PV cells 10 may typically be designed so as for the N portions 20 to adjoin at a center of the array 5. Assuming an even number of portions 20, the latter may further adjoin at one or more in-plane symmetry axes of the array 5 (assuming identical types of PV cells are used in each portion). For example, if N=2 portions 20 are used, they would typically meet at a vertical or horizontal symmetry axis. However, and as noted earlier, the array 5 can involve N=4 portions (quadrants), in which case the portions will typically meet (two-by-two) at a vertical or a horizontal symmetry axis. Using four quadrants eases the design and fabrication of the elements interconnecting the PV cells.

In embodiments as depicted in FIGS. 1-4, the array 5 is rectangular and decomposes into N=4 rectangular portions 20 of distinct sets of cells 10. Each of the portions 20 meets two contiguous portions at boundaries extending parallel to symmetry axes of the array 5. Each portion comprises a same number of PV cells 10, all interconnected through elements 31-37. Also, and as said earlier, the cells can all be of a same type. Yet, the cells may slightly differ, in terms of electrical characteristics, and be sorted so as to even out voltages and allow a more efficient collection of electrical power, as evoked earlier.

An advantageous design of electrical interconnects will now be discussed in detail, in reference to FIGS. 4-7. Here the electrical interconnects 31-37 comprise, for each of the N portions 20, a pair of stacked electrode elements 31, 37. The pair of elements includes a top electrode element 31 and a bottom electrode element 37. As better seen in FIGS. 5-7, the top element 31 and the bottom element 37 comprise, each, respective elongated contact elements 311, 371 ("elongated" means having an aspect ratio>1).

Figure 5:
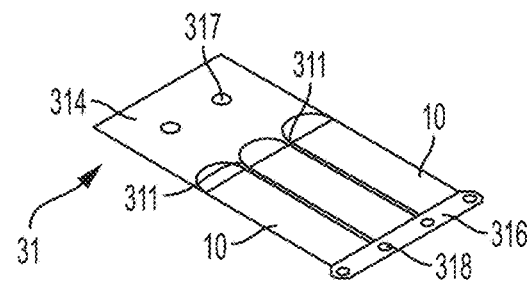
FIGS. 5-7 are 3D views illustrating high-level fabrication steps of a PV module, according to embodiments.
Figure 6:
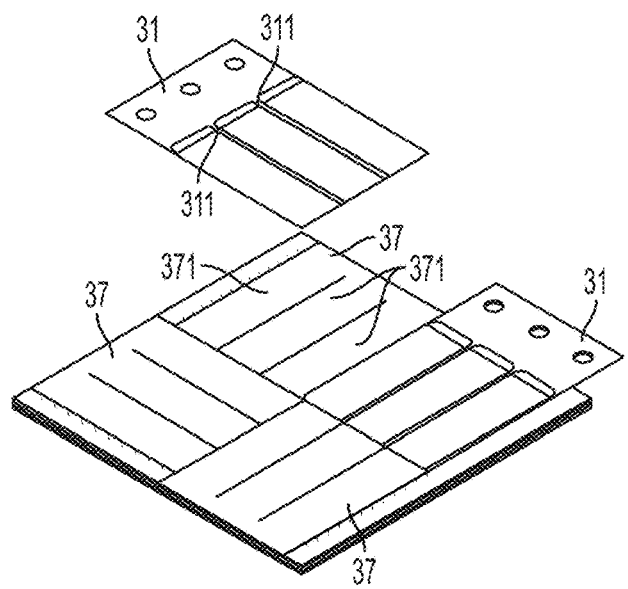
Figure 7:
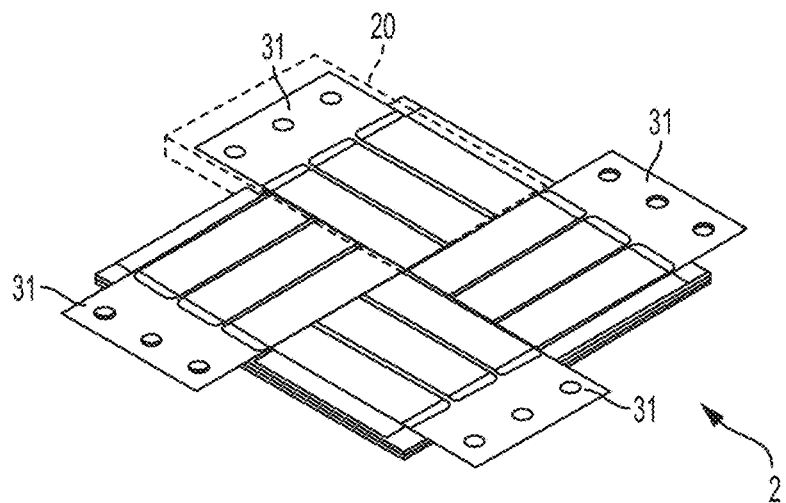

As further illustrated in the fabrication sequence of FIGS. 5-7, a top electrode element 31 is arranged between PV cells 10 and the bottom electrode element 37 of a respective portion 20. The elongated contact elements 311 of the top electrode elements are rotated by $\pi/2$ (90°) with respect to elongated contact elements 371 of the bottom electrode elements 37. As it can be realized, using rotated electrode elements 311, 371 as shown in FIGS. 5-7 results in forming crosspoint structures 311, 371 that electrically connect PV cells 10 of each portion 20 in parallel, using only two layers of elements 311, 371. This eases the fabrication of electrodes and the interconnection of the cells 10. Such a design has no adverse impact on the areal density of PV cells and gives rise to a vertically compact electrode arrangement, which makes the module compatible with a variety of cooling solutions.

In practice, an assembly 10, 31 of PV cells and top electrode element can be fabricated as follows. For each portion, the PV cells 10 are first placed onto a template structure, e.g., an injection molded tray with a graphite coating, comprising a template (formed by embedded structures) identifying positions of cells within that portion. Then, PV cells are picked and placed onto the template structure, so as to be aligned with the embedded structures. Next, a top electrode element 31 is placed on top of the cells 10. Holes 317, 318 (FIG. 5) formed in opposite reinforcement strips 314, 316 of the element 31 are used to suitably align the top element 31 on the template structure, thanks to protruding alignment pins on the template structure. This way, thin conductors 311 get aligned between columns of cells 10. Finally, the element 31 is soldered onto the aligned cells 10 and the resulting assembly 10, 31 is dissociated from the template structure. We note that the reinforcement strips 314, 316, or lugs, are not only useful during for the fabrication but also for the subsequent packaging process of FIGS. 6-7.

Figure 4:
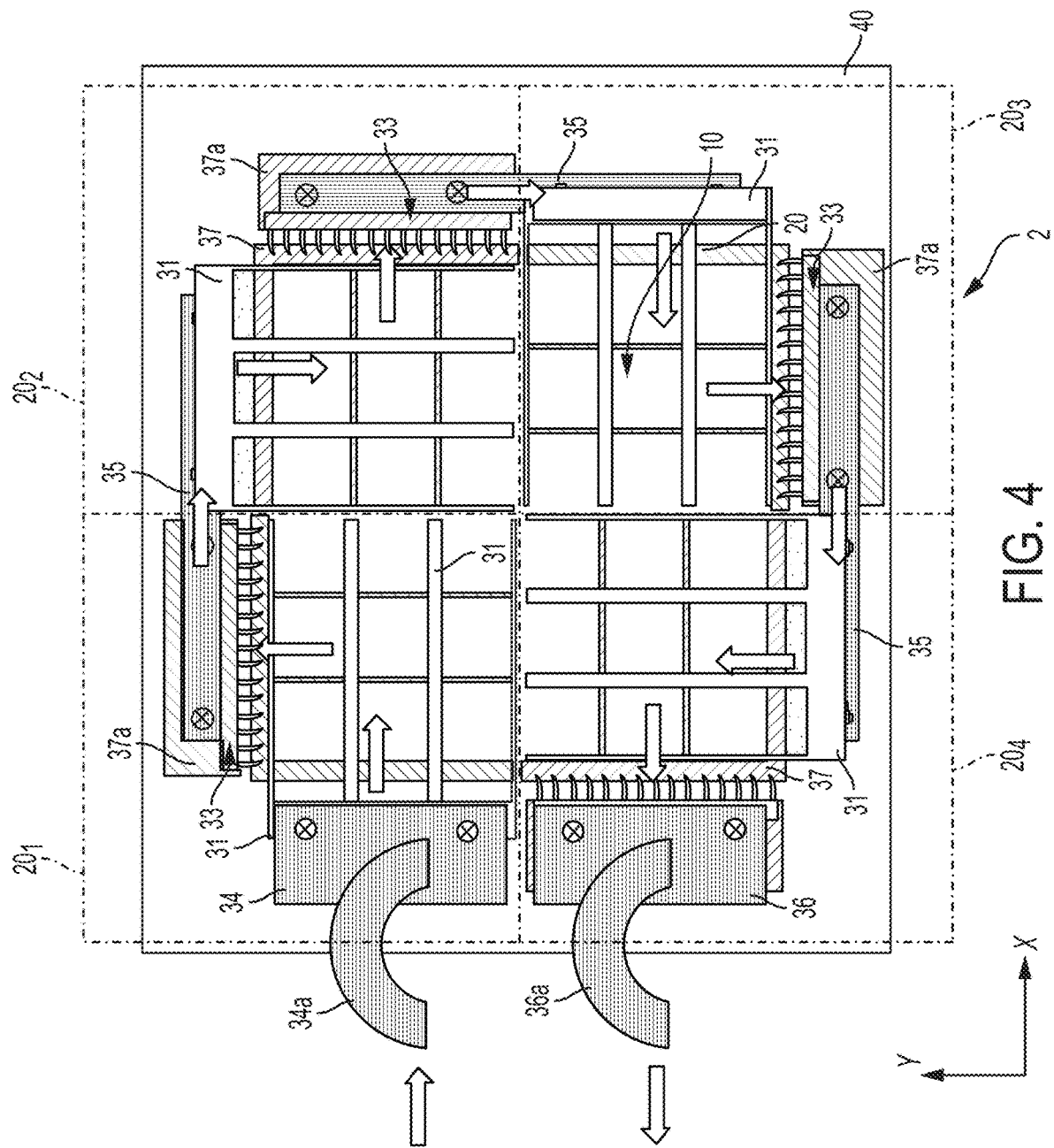
FIG. 4 is a top view of a PV module as in FIGS. 1-3, illustrating how the PV cells and portions of the modules can be connected thanks to a particular design of interconnects, as involved in embodiments.

The portions need then be connected in series, two-by-two. For example, and as depicted in FIG. 4, the bottom electrode element 37 of portion 201 is electrically connected to the top electrode element 31 of portion 202, whose bottom element 37 is connected to the top element 31 of portion 203, and so on. More generally, in an array comprising N portions, the bottom electrode element of the nth portion can be electrically connected to the top electrode element of the n+1th (contiguous) portion, $n \in [1, N-1]$.

This can be achieved thanks to a rotational arrangement of peripheral, electrical connectors 33, 35, 37a. That is, the electrical interconnects may comprise N−1 sets of peripheral conductors 33, 35, 37a, arranged so as to connect the bottom electrode element 37 of the nth portion with the top electrode element 31 of the n+1th portion.

The conductors 35 may for instance be mere bars, extending along one side of the array 5, and parallel to edges of two contiguous portions 20i, 20i+1, to which top elements 31 are soldered. Electrical contact with the bottom electrode elements 37 may be achieved via spring contact elements 33 and additional peripheral parts 37a. In addition, the top electrode elements 31 can comprise, each, a lug 314 protruding in-plane, outwardly from the array 5, so as to make electrical contact with one of the N peripheral bars 35. As mentioned earlier, this lug 317 may also serve as reinforcement for the fabrication process and may comprise holes 317 for alignment purposes.

For completeness, wires or copper bars 34a, 36a are used to connect a power user (not shown) to the two terminals 201, 204 (so far not connected) of the open loop formed by in-series connected portions 201-202-203-204. If necessary, copper bars 34, 36 are provided to make contact with the terminals. Connectors 31, 33, 34, 34a, 35, 36, 36a, 37, 37a can be made of materials (e.g., copper) designed to have a low electrical resistance. Also, the electrical interconnects should generally be configured to provide contacts with low electrical resistance to the PV cells 10. The PV cells and connecting elements are assembled on a substrate 40, which may possibly comprises cooling conduits or channels (not shown).

Next, according to another aspect, the invention can be embodied as a method of fabrication of a photovoltaic module 2 as described above. Aspects of such a method have already been evoked in respect of FIGS. 5-8. Basically, such a method aims at fabricating an array 5 of PV cells, partitioned into PV cell portions, as described earlier in reference to FIGS. 1-4. As described above in reference to FIGS. 5-7, suitable electrical interconnects 31-37 can be fabricated and assembled, so as to connect PV cells of each portion in parallel and the portions in series.

Figure 9:
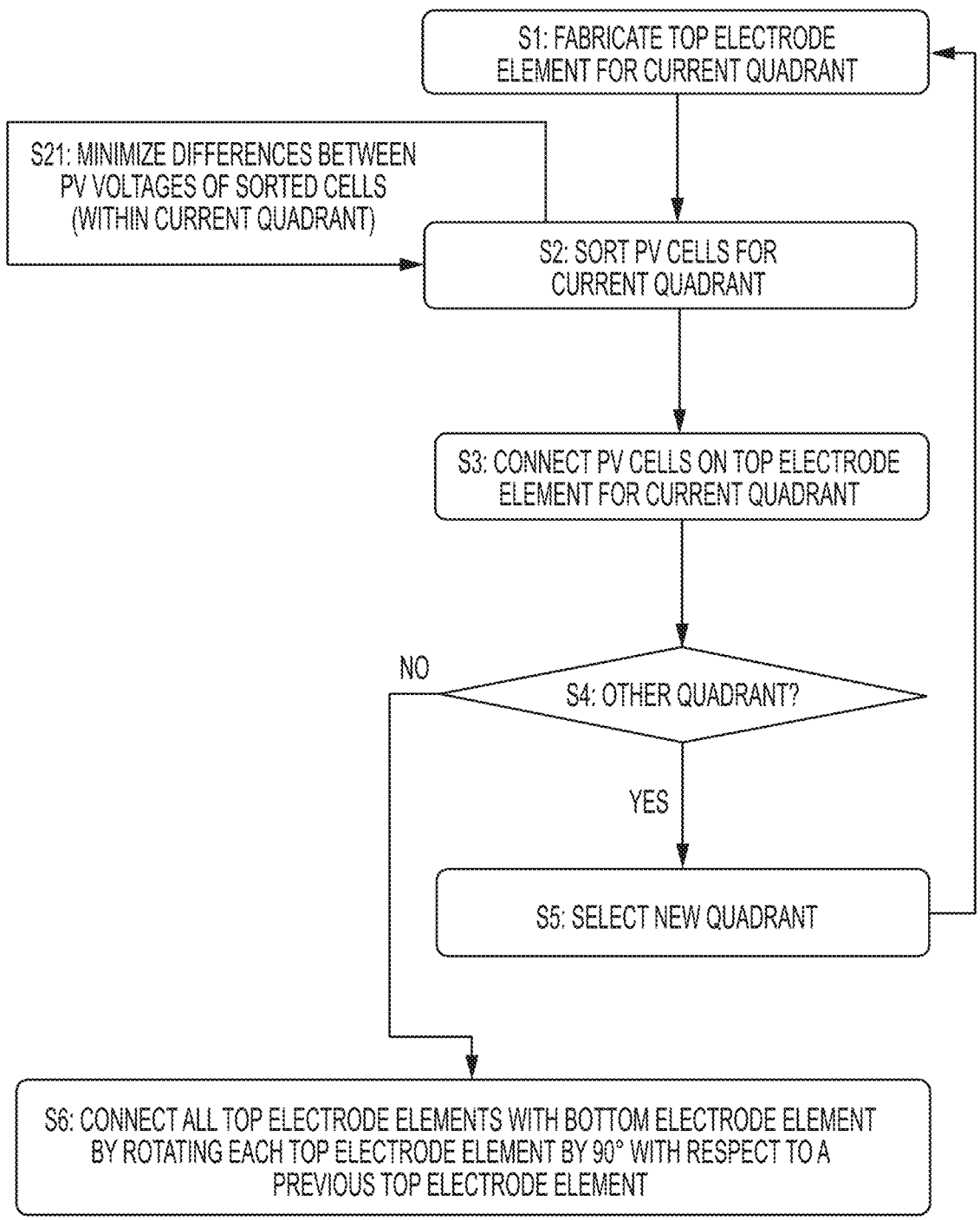
FIG. 9 is a flowchart illustrating high-level steps of a fabrication method of a PV module, as in embodiments.

As illustrated in the flowchart of FIG. 9, top electrode elements 31 need be fabricated for each portion, step S1. PV cells 10 are connected to this element 31, step S3, to form an assembly as otherwise depicted in FIG. 5. These operations are repeated for each portion, steps S4, S5. Eventually, all portions are assembled with and connected to the lower electrode elements 37, step S6, as previously described in reference to FIGS. 5-6.

In embodiments, the PV cells are furthermore sorted or binned, prior to the assembly of each of the portions, and so as to minimize differences between photovoltaic voltages of the cells, step S2. Indeed, the illumination onto the different cells of the arrays can substantially differ, e.g., change from high illumination (e.g., 5 on a scale of 1 to 5, as in FIG. 2) to medium illumination (e.g., 2 or 3), and low illumination (e.g., 1). Of course, FIGS. 1-2 reflect a mere pedagogical example. Cells within each portion can nevertheless be sorted such that the relative photovoltaic voltages of the cells when illuminated during operation are as identical as possible, so that maximum power can be extracted. Typically, the output voltage of a cell depends on illumination and, for high-illumination regions, cells will tend to produce lower output voltage compared with lower-illumination regions. This can be exploited by said sorting or binning of cells in order to even out voltages during operation and allow a more efficient production of electrical power.

Note that higher-illumination results in higher cell voltage under open-circuit conditions (no current flow), while under operating conditions with current flow the cells with higher illumination will have lower voltage output due to ohmic losses on that cell, i.e., the voltage drop due to ohmic losses outweighs the open-circuit voltage increase at higher illumination.

Referring now to FIG. 8, another aspect of the invention is now described, which concerns a photovoltaic system 1. This system comprises a PV module 2 such as described herein. If necessary, the system 1 may comprise several PV modules 2. As further symbolically depicted in FIG. 8, the system 1 can comprises a monitoring unit 54. The monitoring unit 54 is in electrical communication with the electrical interconnects 31-37 of a PV module 2 of the system 1. This monitoring unit is configured to monitor electrical signals provided from each of the N portions 20, via the electrical interconnects 31-37.

In embodiments, the PV system 1 further comprises optical transmission means 61, 62, positioning means 53, and a controller 54. Optical transmission means 61, 62 are known per se and are generally configured to direct light onto the array 5 of PV cells 10 of the PV module 2 of the system 1. For example, the optical transmission means 61, 62 may comprise an optical concentrator to concentrate light onto the array 5 of PV cells 10. The optical concentrator typically comprises optics (e.g., mirrors or lenses), configured to concentrate 101-103 sunlight 100 onto a small area of PV material, as known per se. Various positioning means 53 are known, which allow a position and/or an orientation of the optical transmission means 61, 62 and/or the PV module 2 to be adjusted in the PV system 1. In FIG. 8, positioning means 53 are shown which allow a curved mirror 61 to be oriented with respect to sunlight 100.

The controller 54, which may be lodged in the same computerized unit 54 as the monitoring unit, is operatively connected to the positioning means 53 to adjust positions and/or orientations, based on feedback signals it receives from the monitoring unit. To that aim, the monitoring unit 54 is operatively connected to the controller 54 to provide it with feedback signals, based on electrical signals it received from each of the N portions 20 that it monitors, in operation. The controller 54 can be implemented by the same computerized unit 54 that implements the monitoring functions. In variants, part or all of the functions of the monitoring unit may be implemented locally, at the module 2, thanks to an embedded processor, operatively connected to the controller.

In embodiments, the monitoring unit 54 is further configured to compute feedback signals by minimizing differences between voltages outputted by the N portions 20, based on the monitored electrical signals. As mentioned earlier, current produced by each portion may also be used, in principle, as a feedback signal. Yet, relying on voltages makes it more practical, as it allows sensing much lower light source intensities in practice. As a result, exposure to ambient light suffices to align or calibrate the PV module.

The above principles can be used for sun-tracking purposes in CPV or HCPV systems or to align such systems. That is, electrical signals as independently obtained from each portions 20 of PV cells 10 may be used to obtain feedback signals and adjust the optical transmission means 61, 62, such that a symmetric illumination pattern is achieved. This, in turn, allows substantially equal currents to be generated by each of the N portions 20.

The present concepts can more generally be applied to point focus systems. Yet, the general concepts described herein may also be applied to linear focus systems (using N=2 portions).

Figure 10:
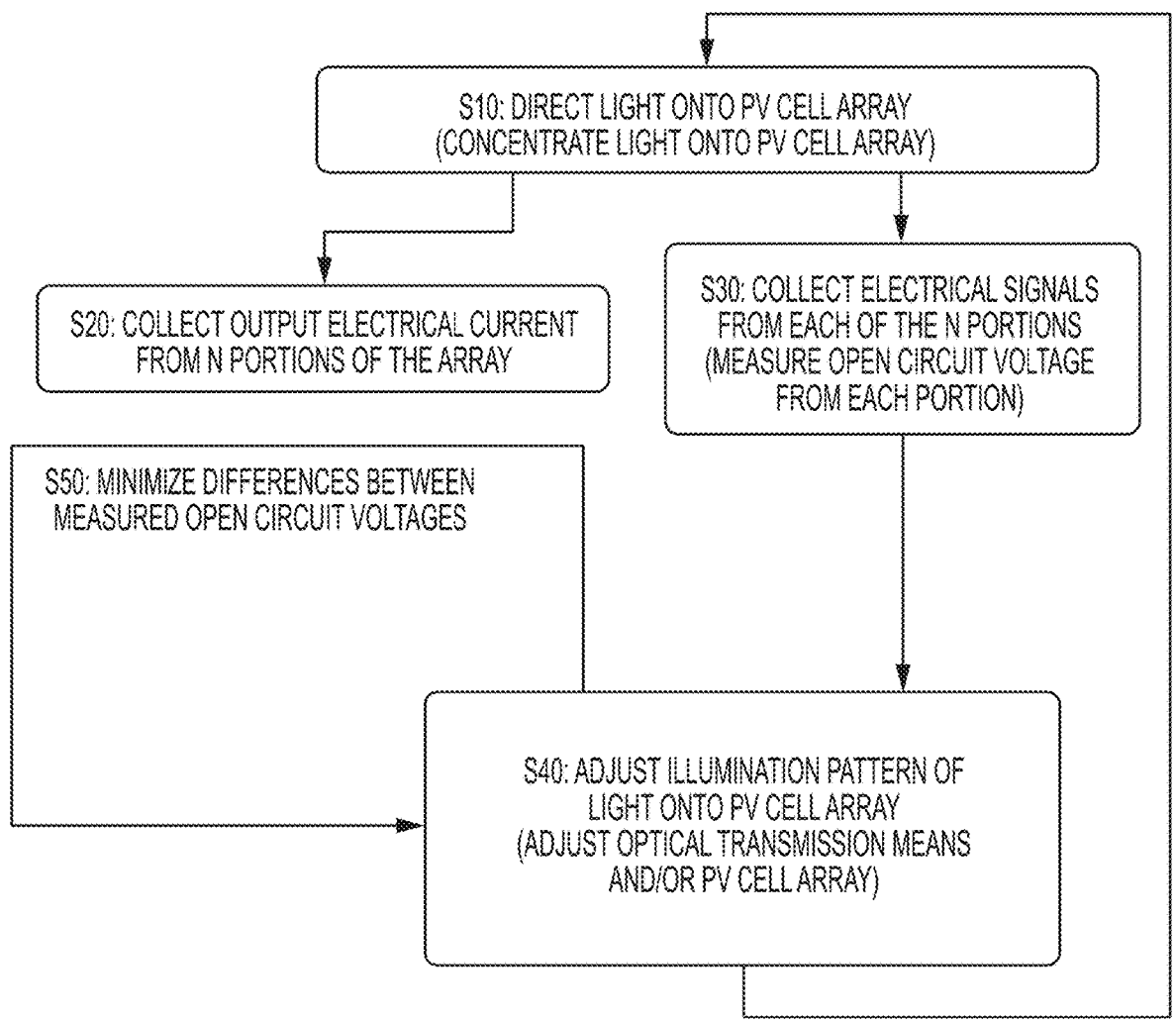
FIG. 10 is a flowchart illustrating high-level steps of a method for adjusting an illumination pattern of light onto portions of a PV module, according to embodiments.

Next, according to another aspect, the invention can be embodied as methods of operating a photovoltaic module 2 or a system 1 comprising such a module 2, as described above. Aspects of such methods have already been evoked in respect of FIGS. 1-8 and are therefore only briefly recalled now, in reference to FIG. 10. Basically, such methods revolve around directing light onto said array 5 of PV cells 10 (step S10, FIG. 10), and collecting S20 an output electrical current from the N portions 20 connected in series, while electrical signals are collected S30 from each of the N portions 20, so as to optimize the electrical power outputted from the N portions 20.

As evoked earlier, an illumination pattern of light directed onto said array 5 of PV cells 10 may be adjusted S40, so as to increase electrical power outputted from the N portions 20, based on electrical signals collected S3 from each of the N portions. The adjustment of the illumination pattern may for example be performed by adjusting a position and/or an orientation of the optical transmission means 61, 62 and/or the array 5 of PV cells 10. This adjustment can be performed based on voltage measurements, as obtained via electrical interconnects 31-37 for each portion 20.

In particular, the illumination pattern can be adjusted by minimizing differences between the measured voltages.

Assume for instance that the array 5 is partitioned into four quadrants, as in FIG. 4. Here, the voltage differences can be minimized both horizontally and vertically. That is, the difference between voltages obtained for, on the one hand, the circuit formed by quadrants 203 and 204 and, on the other hand, the circuit formed by quadrants 201 and 202 has to be minimized, e.g., to zero, for horizontal symmetry. Meanwhile, the difference between voltages obtained for, on the one hand, the circuit formed by 201 and 204 and, on the other hand, the circuit formed by 202+203 has to be minimized for vertical symmetry. More generally, the voltage differences to be considered depend on the number and arrangement of the portions, i.e., on the symmetry of the array.

As explained earlier in reference to FIG. 8, the minimization can be implemented as a feedback circuit, involving:

Electrical interconnects 31-37, to make it possible to collect individual electrical signals for each portions;

A monitoring unit 54, to monitor such signals and compute current voltage differences; and A controller 54, which, based on feedback signals obtained from the monitoring unit, modifies a geometrical configuration of the system.

In sun-tracking applications, the illumination pattern is repeatedly adjusted so as to track the moving light source. The same principle can be used for aligning the array 5 of PV cells 10 and/or the optical concentrator towards a source of the light. In each case, the aim is to optimize the electrical power outputted from the portions 20 of PV cells.

Computerized devices, such as the device 54, can be suitably designed for implementing parts of the functions described herein. In that respect, it can be appreciated that the methods described herein are largely non-interactive and automated. The methods described herein can for instance be implemented in software (e.g., firmware), hardware, or a combination thereof. In exemplary embodiments, the methods described herein are implemented in software, as an executable program, the latter executed by suitable digital processing devices. More generally, embodiments of the present invention can be implemented where general-purpose digital computers, such as personal computers, workstations, etc., are used.

For instance, the computerized device 54 shown in FIG. 8 may be, e.g., a general-purpose computer. In exemplary embodiments, in terms of hardware architecture, the unit 54 includes a processor, a memory coupled to a memory controller, and one or more input and/or output (I/O) devices (or peripherals) that are communicatively coupled via a local input/output controller, which may further ensure data communication to and from the interconnects 31-37. The input/output controller may have additional elements, such as controllers, buffers (caches), drivers, repeaters, and receivers, to enable communications. Further, the local interface may include address, control, and/or data connections to enable appropriate communications among the aforementioned components.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method of operating a photovoltaic module, the method comprising:

directing light onto an array of photovoltaic cells, or PV cells, wherein the array consisting of N portions, N>=2;

collecting an output electrical current from N portions connected in series via electrical interconnects, N being even, the electrical interconnects consisting of N-1 number of peripheral conductors, N number of top electrode elements, and N number of bottom electrode elements positioned below the top electrode elements; and collecting electrical signals from each of the N portions, wherein:

all of the PV cells in the array are arranged to be circumscribed within a boundary;

the peripheral conductors are positioned along predefined edges of the boundary so as to circumscribe all of the PV cells therein and such that there is no overlap between the PV cells being circumscribed within the boundary and the peripheral conductors along predefined edges of the boundary;

each of the top electrode elements has an end part and an opposite end part, the end part being positioned within the predefined edges of the boundary and the opposite end part extending over the peripheral conductors along the predefined edges of the boundary for only N-1 number of the top electrode elements;

each of the peripheral conductors crosses two adjacent portions of the N portions, each of the peripheral conductors comprising a piece that extends under the opposite end part of only one of the top electrode elements, the peripheral conductors on different edges of the predefined edges being physically separated from one another such that one peripheral conductor on one side of one of the PV cells is physically separated from another peripheral conductor on an adjoining side of the one of the PV cells.

2. The method according to claim 1, further comprising adjusting an illumination pattern of light directed onto said array of PV cells to increase electrical power outputted from the N portions, based on electrical signals collected from each of the N portions.

3. The method according to claim 2, where:

adjusting the illumination pattern is performed by adjusting a position and/or an orientation of an optical concentrator and/or the array of PV cells.

4. The method according to claim 2, where:

the method further comprises, while collecting electrical signals from each of the N portions, measuring, via said electrical interconnects, a voltage from said each of the N portions; and adjusting the illumination pattern is performed based on voltages measured for the N portions.

5. The method according to claim 4, where:
adjusting the illumination pattern is performed so as to minimize one or more differences between measured voltages.

6. The method according to claim 3, where:
directing light onto said array of photovoltaic cells comprises concentrating light onto said array of PV cells.

7. The method according to claim 3, where:
said illumination pattern is repeatedly adjusted so as to track a moving source of the light.

8. The method according to claim 3, for aligning a photovoltaic system, or PV system, where:
the method further comprising, while collecting electrical signals from each of the N portions:
aligning the array of PV cells and/or the optical concentrator towards a source of the light, to increase electrical power outputted from the N portions.

9. A method of fabrication of a photovoltaic module according to claim 1, the method comprising
fabricating said array of PV cells and said electrical interconnects.

10. The method according to claim 9, where:
fabricating the array of PV cells comprises, for each of the portions, sorting cells within said each of the portions to minimize differences between photovoltaic voltages of the sorted cells.

11. The method of claim 1, wherein the top electrode elements are formed in a rotational arrangement in a geometric shape to circumscribe all of the PV cells within the boundary and the peripheral conductors along predefined edges of the boundary, the rotational arrangement having the opposite end parts each extend out in different directions toward the predefined edges of the boundary.

12. The method of claim 1, wherein the top electrode elements comprise elongated contact elements perpendicular to a base.

13. The method of claim 1, wherein the N portions each comprise an equal number of the PV cells such that the equal number of the PV cells are electrically connected by the peripheral conductors along the predefined edges.

* * * * *